(12) United States Patent
Hwang

(10) Patent No.: US 9,099,408 B2
(45) Date of Patent: Aug. 4, 2015

(54) ORGANIC LIGHT-EMITTING DIODE (OLED) DISPLAY

(71) Applicant: Samsung Display Co., Ltd., Yongin, Gyeonggi-do (KR)

(72) Inventor: Jun Hwang, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/067,820

(22) Filed: Oct. 30, 2013

(65) Prior Publication Data

US 2014/0353612 A1 Dec. 4, 2014

(30) Foreign Application Priority Data

May 30, 2013 (KR) .................. 10-2013-0061828

(51) Int. Cl.
H01L 27/32 (2006.01)
H01L 51/52 (2006.01)
H01L 51/56 (2006.01)

(52) U.S. Cl.
CPC .......... H01L 27/322 (2013.01); H01L 27/3246 (2013.01); H01L 27/32 (2013.01); H01L 27/3213 (2013.01); H01L 51/52 (2013.01); H01L 51/56 (2013.01)

(58) Field of Classification Search
USPC .................. 257/40, 59, 72, E51.018, E51.021
See application file for complete search history.

(56) References Cited

U.S. PATENT DOCUMENTS 7,453,198 B2 * 11/2008 Kang et al. ..................... 313/498
7,510,891 B2 * 3/2009 Chun et al. ...................... 438/29
8,004,176 B2 * 8/2011 Kang et al. ..................... 313/504
8,350,464 B1 * 1/2013 Jeong et al. ..................... 313/503
8,461,591 B2 * 6/2013 Lee et al. .......................... 257/59
8,753,905 B2 * 6/2014 Lee et al. .......................... 438/26
2008/0081105 A1 * 4/2008 Suh et al. ......................... 427/58
2009/0243472 A1 * 10/2009 Jeong et al. ..................... 313/504
2010/0052518 A1 * 3/2010 Jeon et al. ....................... 313/504

(Continued)

FOREIGN PATENT DOCUMENTS

KR  10-0659757 B1  12/2006
KR  10-2011-0085777 A  7/2011
KR  10-2011-0094458 A  8/2011

OTHER PUBLICATIONS

Rahimi et al., "Transport mechanism in ambipolar pentacene organic thin film transistors with lithium fluoride gate dielectric," *J. Appl. Phys.* 110, 013702-1-013702-4, (2011); doi: 10.1063/1.3597323.

*Primary Examiner* — Ida M Soward

(74) *Attorney, Agent, or Firm* — Knobbe, Martens, Olson & Bear, LLP

(57) ABSTRACT

An organic light-emitting diode (OLED) display is disclosed. In one aspect, the OLED display includes a substrate having a plurality of pixel areas, which serves as a light-emitting area, and a non-pixel area, which serves as a non-light-emitting area. The OLED display also includes a plurality of first electrodes formed over the substrate in areas respectively corresponding to the pixel areas and a plurality of organic light-emitting layers formed over the first electrodes. The OLED display further includes a pixel defining layer formed in the non-pixel area of the substrate to cover a boundary surface of the organic light-emitting layers and to define the pixel areas, and a second electrode formed over the organic light-emitting layers and the pixel defining layer.

7 Claims, 8 Drawing Sheets

(56) References Cited

U.S. PATENT DOCUMENTS

| | | |
|---|---|---|
| 2011/0065234 A1 | 3/2011 | Cho et al. |
| 2011/0175095 A1 | 7/2011 | Kang et al. |
| 2011/0198598 A1 | 8/2011 | Kim et al. |
| 2012/0007057 A1* | 1/2012 | Choi et al. .................. 257/40 |
| 2012/0080681 A1* | 4/2012 | Kim et al. .................. 257/59 |
| 2012/0220061 A1* | 8/2012 | Kwon et al. ................. 438/29 |
| 2013/0001577 A1* | 1/2013 | Kim et al. .................. 257/71 |
| 2013/0037835 A1* | 2/2013 | Lee et al. ................... 257/91 |
| 2013/0292649 A1* | 11/2013 | Moon et al. ................ 257/40 |
| 2013/0299785 A1* | 11/2013 | Kim et al. .................. 257/40 |
| 2013/0341598 A1* | 12/2013 | Chang et al. ............... 257/40 |
| 2013/0344766 A1* | 12/2013 | Kim et al. .................. 445/24 |
| 2014/0014909 A1* | 1/2014 | Lee et al. ................... 257/40 |
| 2014/0027729 A1* | 1/2014 | So et al. .................... 257/40 |
| 2014/0028181 A1* | 1/2014 | Lee et al. ................... 313/504 |
| 2014/0034919 A1* | 2/2014 | Park et al. .................. 257/40 |
| 2014/0062290 A1* | 3/2014 | Kim .......................... 313/504 |
| 2014/0062292 A1* | 3/2014 | Seong ........................ 313/504 |
| 2014/0084257 A1* | 3/2014 | Kim et al. .................. 257/40 |
| 2014/0252317 A1* | 9/2014 | Gupta et al. ................ 257/40 |

* cited by examiner

ORGANIC LIGHT-EMITTING DIODE (OLED) DISPLAY

CROSS-REFERENCE TO RELATED APPLICATIONS

This U.S. non-provisional patent application claims priority under 35 U.S.C. §119 of Korean Patent Application No. 10-2013-0061828, filed on May 30, 2013, the contents of which are hereby incorporated by reference.

BACKGROUND

1. Field

The described technology generally relates to an organic light-emitting diode (OLED) display and a method of manufacturing the OLED display device.

2. Description of the Related Technology

Generally, organic light-emitting diode (OLED) displays have exceptional brightness and a wide viewing angle. Since OLED displays do not need to include a separate light source, they are also typically thin and light weight. Additionally, OLED displays typically have other characteristics such as fast response speeds, low power consumption, high brightness, etc.

OLED displays generally include an OLED that includes an anode electrode, an organic light-emitting layer, and a cathode electrode. Holes and electrons are injected into the organic light-emitting layer through the anode and cathode electrodes and are recombined in the organic light-emitting layer to generate excitons. The excitons emit energy as light, which is discharged when an exciton returns to a ground state.

In general, a number of anode electrodes are formed on a substrate and an organic insulating layer is formed on the substrate to cover the anode electrodes. The organic insulating layer is patterned to have a number of openings, and thus a pixel defining layer is formed. Portions of the anode electrodes are exposed through the openings of the pixel defining layer. The areas defined by the openings correspond to pixel areas.

Organic light-emitting layers are formed on the anode electrodes in the pixel areas. The organic light-emitting layers can be formed by a printing method, e.g., an inkjet printing method, a nozzle printing method, etc. A cathode electrode is formed to cover the organic light-emitting layers and the pixel defining layer.

SUMMARY OF CERTAIN INVENTIVE ASPECTS

One inventive aspect is an organic light-emitting diode (OLED) display (hereinafter to be interchangeably used with an OLED display device) having a reduced thickness and a uniform brightness.

Another aspect is a method of manufacturing an OLED display.

Another aspect is an OLED display device including a substrate that includes a plurality of pixel areas serving as a light-emitting area and a non-pixel area disposed between the pixel areas and serving as a non-light-emitting area, a plurality of first electrodes disposed on the substrate in areas respectively corresponding to the pixel areas, a plurality of organic light-emitting layers disposed on the first electrodes, a pixel defining layer defining the pixel areas and disposed in the non-pixel area to cover a boundary surface of the organic light-emitting layers, and a second electrode disposed on the organic light-emitting layers and the pixel defining layer.

Each of the first electrodes and each of the organic light-emitting layers have an area greater than the area of the corresponding pixel area, and the pixel defining layer exposes a substantially flat area of the organic light-emitting layers.

The pixel defining layer includes a metal-fluoride ionic compound and the metal-fluoride ionic compound includes one of LiF, BaF2, and CsF. The pixel defining layer has a thickness of about 10 nanometers to about 100 nanometers.

Another aspect is a manufacturing method of the OLED display device including preparing a substrate that includes a plurality of pixel areas serving as a light-emitting area and a non-pixel area disposed between the pixel areas and serving as a non-light-emitting area, forming a plurality of first electrodes on the substrate in areas respectively corresponding to the pixel areas, forming a plurality of organic light-emitting layers on the first electrodes, forming a pixel defining layer on the non-pixel area of the substrate to cover a boundary surface of the organic light-emitting layers and to define the pixel areas, and forming a second electrode on the organic light-emitting layers and the pixel defining layer.

Each of the first electrodes and each of the organic light-emitting layers have an area greater than the area of the corresponding pixel area, and the pixel defining layer exposes a substantially flat area of the organic light-emitting layers.

The pixel defining layer includes a metal-fluoride ionic compound, and the metal-fluoride ionic compound includes one of LiF, BaF2, and CsF. The pixel defining layer has a thickness of about 10 nanometers to about 100 nanometers.

Another aspect is an OLED display device including a substrate that includes a plurality of pixel areas serving as a light-emitting area and a non-pixel area disposed between the pixel areas and serving as a non-light-emitting area, a plurality of first electrodes disposed on the substrate in areas respectively corresponding to the pixel areas, each of the first electrodes having an area greater than the area of the corresponding pixel area, an organic light-emitting layer disposed on the substrate to cover the first electrodes, a pixel defining layer disposed on the organic light-emitting layer in the non-pixel area to cover a boundary surface of the organic light-emitting layer having a predetermined inclination angle and to expose a substantially flat area of the organic light-emitting layer in the pixel area, a second electrode disposed on the organic light-emitting layer and the pixel defining layer, and a plurality of color filters disposed on the second electrode. The color filters are repeatedly arranged in three consecutive pixel areas among four adjacent pixel areas in the pixel areas.

Another aspect is a manufacturing method of the OLED display device including preparing a substrate that includes a plurality of pixel areas serving as a light-emitting area and a non-pixel area disposed between the pixel areas and serving as a non-light-emitting area, forming a plurality of first electrodes on the substrate in areas respectively corresponding to the pixel areas, each of the first electrodes having an area greater than the area of the corresponding pixel area, forming an organic light-emitting layer on the substrate to cover the first electrodes, forming a pixel defining layer on organic light-emitting layer in the non-pixel area to cover a boundary surface of the organic light-emitting layer having a predetermined inclination angle and to expose a substantially flat area of the organic light-emitting layer in the pixel areas, forming a second electrode on the organic light-emitting layer and the pixel defining layer, forming a thin film sealing layer on the second electrode, and forming a plurality of color filters on the thin film sealing layer. The color filters are repeatedly arranged in three consecutive pixel areas among four adjacent pixel areas in the pixel areas.

Another aspect is an OLED display device including a substrate that includes a plurality of pixel areas serving as a light-emitting area and a non-pixel area disposed between the pixel areas and serving as a non-light-emitting area, a plurality of first electrodes disposed on the substrate in areas respectively corresponding to the pixel areas, each of the first electrodes having an area greater than the area of the corresponding pixel area, a pixel defining layer disposed on the substrate to cover a boundary surface of the first electrodes and including openings to expose a predetermined portion of the first electrodes, a plurality of organic light-emitting layers disposed on the predetermined portion of the first electrodes exposed by the openings, a second pixel defining layer disposed to cover a portion of a side surface of the first pixel defining layer adjacent to the organic light-emitting layers and a portion of the organic light-emitting layers adjacent to the side surface of the first pixel defining layer, and a second electrode disposed on the first pixel defining layer, the second pixel defining layer, and the organic light-emitting layers. The portion of the organic light-emitting layers adjacent to the side surface of the first pixel defining layer has a greater thickness than the other areas of the organic light-emitting layers, the first and second pixel defining layers are disposed in the non-pixel area, and the second pixel defining layer exposes a substantially flat area of the organic light-emitting layer.

According to some embodiments, the OLED display device may have a reduced thickness and a substantially uniform brightness.

BRIEF DESCRIPTION OF THE DRAWINGS

The above described and other advantages of the disclosed technology will become readily apparent with reference to the following detailed description when considered in conjunction with the accompanying drawings.

DETAILED DESCRIPTION OF CERTAIN INVENTIVE EMBODIMENTS

Figure 1:
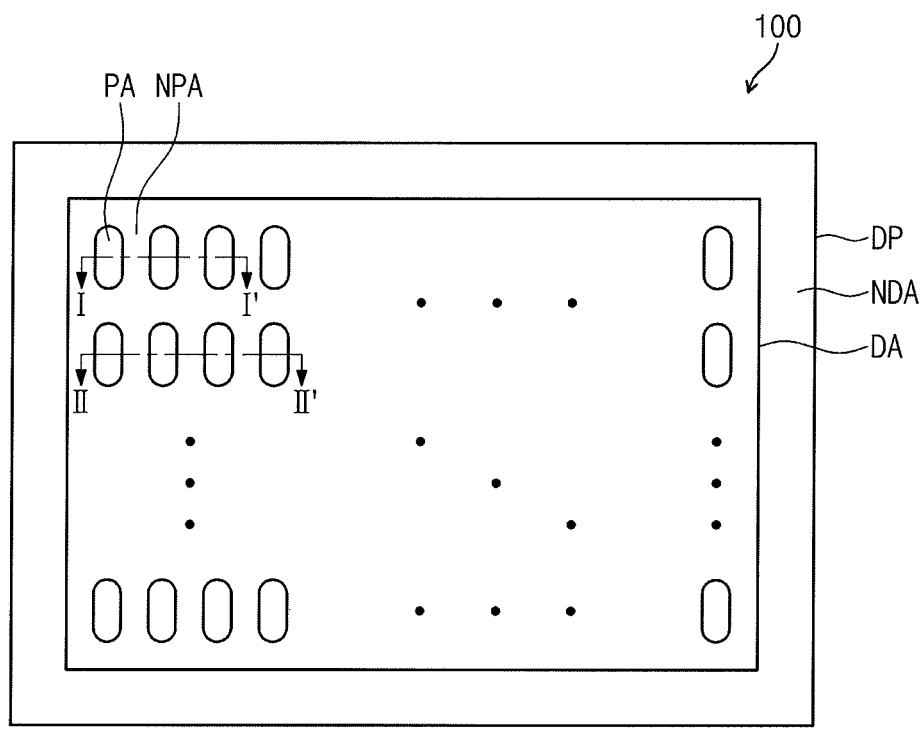
FIG. 1 is a plan view schematically showing an OLED display device according to a first exemplary embodiment.

It will be understood that when an element or layer is referred to as being "on", "connected to" or "coupled to" another element or layer, it can be directly on, connected to or coupled to the other element or layer or intervening elements or layers may be present. In contrast, when an element is referred to as being "directly on," "directly connected to" or "directly coupled to" another element or layer, there are no intervening elements or layers present. Throughout the specification, "connected" and "coupled" respectively include "electrically connected" and "electrically coupled." Like reference numerals refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the described technology.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein should be interpreted accordingly.

The terminology used herein is for the purpose of describing particular embodiments only and is not intended to be limiting of the disclosure. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which described technology belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the described technology will be explained in detail with reference to the accompanying drawings.

FIG. 1 is a plan view schematically showing an organic light-emitting diode (OLED) display device according to a first exemplary embodiment.

Referring to FIG. 1, an OLED display device 100 according to the first exemplary embodiment includes a display panel DP. The display panel DP includes a display area DA which displays an image thereon and a non-display area NDA surrounding the display area DA which does not display images.

The display area DA of the display panel DP includes a plurality of pixel areas PA corresponding to a light-emitting area and a non-pixel area NPA disposed between the pixel areas PA corresponding to a non-light-emitting area. The pixel areas PA generate light to display an image and are arranged in a substantially matrix configuration.

Figure 2:
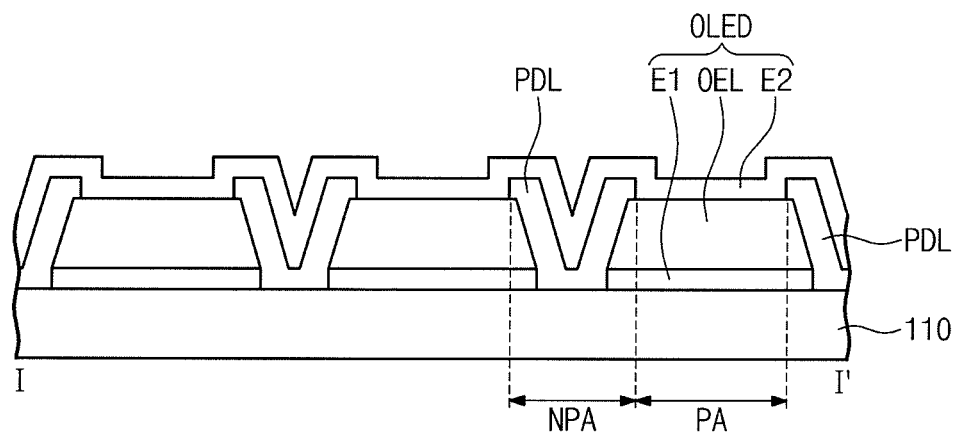
FIG. 2 is a cross-sectional view taken along a line I-I' of FIG. 1.
Figure 3:
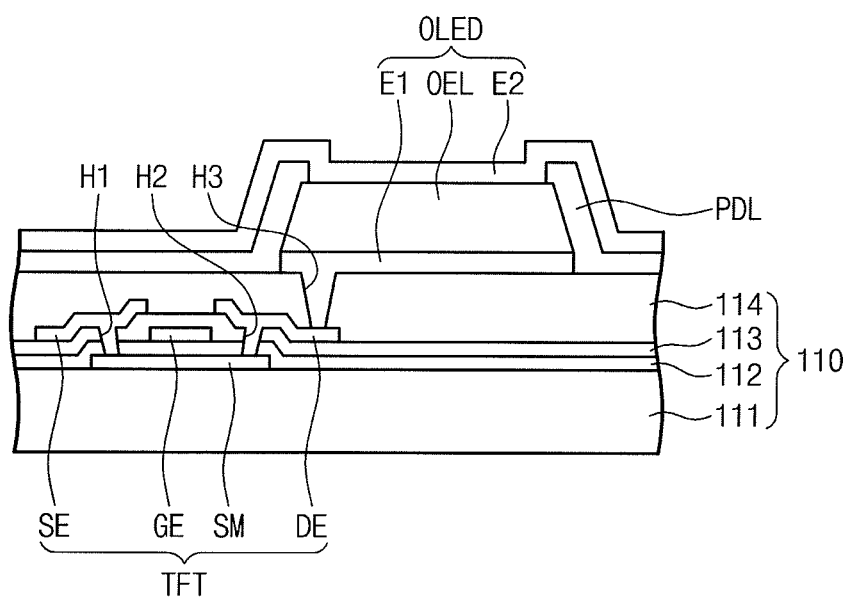
FIG. 3 is a cross-sectional view showing a thin film transistor connected to the OLED device shown in FIG. 2.

The pixel areas PA are defined by a pixel defining layer (refer to FIGS. 2 and 3). OLEDs (refer to FIGS. 2 and 3) are disposed in the pixel areas PA. Each of the OLEDs receives a corresponding driving voltage to display an image and generate light.

Hereinafter, a cross-sectional structure of the OLED display device 100 will be described in detail.

FIG. 2 is a cross-sectional view taken along a line I-I' of FIG. 1. FIG. 3 is a cross-sectional view showing a thin film transistor connected to the OLED shown in FIG. 2.

FIG. 2 shows a cross-sectional view of three arbitrary pixel areas adjacent to each other; other pixel areas PA have the same structure as the pixels illustrated in FIG. 2. In addition, FIG. 3 shows a cross-sectional view of a thin film transistor TFT connected to one arbitrary OLED, however, the other OLEDs are connected to corresponding thin film transistors TFT having the same structure as the thin film transistors TFT shown in FIG. 3.

Referring to FIGS. 2 and 3, the display panel DP includes a substrate 110, a plurality of OLEDs disposed on the substrate 110, and a pixel defining layer PDL which defines the OLEDs in the display area DA.

In the display area DA, the substrate 110 includes the pixel areas PA corresponding to the light-emitting area and the non-pixel area NPA corresponding to the non-light-emitting area.

A plurality of first electrodes E1 are disposed on the substrate 110. The first electrodes E1 are disposed in areas respectively corresponding to the pixel areas PA. Each of the first electrodes E1 has a size greater than that of the corresponding pixel area PA. Each of the first electrodes E1 may serve as a pixel electrode or an anode electrode.

The first electrodes E1 are formed as transparent electrodes or reflective type electrodes. When the first electrode E1 is a transparent electrode, the first electrode E1 may include indium tin oxide (ITO), indium zinc oxide (IZO), zinc oxide (ZnO), etc. When the first electrode E1 is a reflective type electrode, the first electrode E1 may include a transparent layer formed of Ag, Mg, Al, Pt, Pd, Au, Ni, Nd, Ir, Cr, or alloys thereof and a transparent conductive layer formed of ITO, IZO, ZnO, etc.

Organic light-emitting layers OEL are disposed on the first electrodes E1. Each of the organic light-emitting layers OEL has a size greater than that of the corresponding pixel area PA. The organic light-emitting layers OEL may include an organic material that generates red, green, or blue light, but is not limited thereto. That is, the organic light-emitting layers OEL may generate white light.

Each of the organic light-emitting layers OEL may be formed of a low-molecular organic material or a high-molecular organic material. Although not shown in figures, each of the organic light-emitting layers OEL may have a multi-layered structure including a hole injection layer, a hole transport layer, an emission layer, an electron transport layer, and an electron injection layer. For instance, the hole injection layer may be disposed on the first electrode E1, and the hole transport layer, the emission layer, the electron transport layer, and the electron injection layer may be sequentially stacked on the hole injection layer.

The organic light-emitting layers OEL may be formed by a printing process. A fluid organic material may be printed and dried by the printing process to form the organic light-emitting layers OEL. When the organic light-emitting layers OEL are formed by printing the fluid organic material, a boundary surface of each of the organic light-emitting layers OEL has a predetermined inclination angle.

The pixel defining layer PDL is disposed in the non-pixel area NPA on the substrate 110 to cover the boundary surface having the predetermined inclination angle of the organic light-emitting layers OEL. In addition, the pixel defining layer PDL is disposed in the non-pixel area NPA on the substrate 110 to expose a substantially flat area (hereinafter to be interchangeably referred to as a "flat area") of the organic light-emitting layers OEL. Thus, the pixel areas PA are defined by the pixel defining layer PDL. The pixel defining layer PDL has an insulating property.

The pixel defining layer PDL may include a metal-fluoride ionic compound. In detail, the pixel defining layer PDL may be formed of a metal-fluoride ionic compound such as LiF, BaF2, or CsF. When the metal-fluoride ionic compound has a predetermined thickness, the metal-fluoride ionic compound has an insulating property. For instance, when the pixel defining layer PDL has a thickness of at least about 10 nanometers, the pixel defining layer PDL has an insulating property. In the present exemplary embodiment, the pixel defining layer PDL has a thickness of about 10 nanometers to about 100 nanometers. However, according to some embodiments, the thickness of the pixel defining layer PDL may be less than about 10 nanometers or may be greater than about 100 nanometers.

A second electrode E2 is disposed on the pixel defining layer PDL and the organic light-emitting layers OEL. The second electrode E2 may serve as a common electrode or a cathode electrode.

The second electrode E2 may be formed as a transparent electrode or a reflective type electrode. When the second electrode E2 is a transparent electrode, the second electrode E2 may include a layer formed by depositing one of Li, Ca, LiF/Ca, LiF/Al, Al, Mg, or compounds thereof on the organic light-emitting layer and a sub-electrode formed on the layer with a transparent conductive material, such as ITO, IZO, ZnO, etc. When the second electrode E2 is a reflective type electrode, the second electrode E2 may be formed of Ag, Mg, Al, Pt, Pd, Au, Ni, Nd, Ir, Cr, Li, Ca, LiF/Ca, LiF/Al or compounds thereof.

In the case that the OLED display device 100 is a front surface light emission type, the first electrode E1 serves as a reflective type electrode and the second electrode E2 serves as a transparent electrode. In the case that the OLED display device 100 is a rear surface light emission type, the first electrode E1 serves as a transparent electrode and the second electrode E2 serves as a reflective type electrode.

The organic light-emitting device OLED is formed by the first electrode E1, the organic light-emitting layer OEL, and the second electrode E2 in the pixel area PA. That is, the organic light-emitting device OLED is disposed in the pixel area PA and includes the first electrode E1, the organic light-emitting layer OEL, and the second electrode E2 in each pixel area PA.

The first electrodes E1 may be positive electrodes which inject holes and the second electrode E2 may be a negative electrode which injects electrons, but the first and second electrodes E1 and E2 are not limited thereto. That is, the first electrodes E1 may be negative electrodes which inject the electrons and the second electrode E2 may be the positive electrode which injects the holes.

The substrate 110 includes a base substrate 111, a first insulating layer 112, a second insulating layer 113, a protection layer 114, and thin film transistors TFT. Each thin film transistor TFT is connected to and drives a corresponding OLED.

The base substrate 111 may be a transparent insulating substrate which may be formed of glass, quartz, ceramic, etc., or a transparent flexible substrate which may be formed of plastic. In addition, the base substrate 111 may be a metal substrate formed of stainless steel.

Each of the thin film transistors TFTs has substantially the same structure. Thus, hereinafter, the structure of one thin film transistor TFT will be described in detail.

A semiconductor layer SM of the thin film transistor TFT is disposed on the base substrate 111. The semiconductor layer SM may be formed of an inorganic semiconductor material, e.g., an amorphous silicon, polysilicon, etc., or an organic semiconductor material. In addition, the semiconductor layer SM may be formed of an oxide semiconductor material. Although not shown in FIG. 3, the semiconductor layer SM may include a source area, a drain area, and a channel area between the source area and the drain area.

The first insulating layer 112 is formed to cover the semiconductor layer SM. The first insulating layer 112 may serve as a gate insulating layer.

A gate electrode GE of the thin film transistor TFT is formed on the first insulating layer 112 to overlap the semiconductor layer SM. In detail, the gate electrode GE substantially overlaps the channel area of the semiconductor layer SM. The gate electrode GE is connected to a gate line (not shown), which applies an on/off signal to the thin film transistor TFT.

The second insulating layer 113 is formed to cover the gate electrode GE. The second insulating layer 113 may serve as an inter-insulating layer.

A source electrode SE and a drain electrode DE of the thin film transistor TFT are formed on the second insulating layer 113 and are spaced apart from each other. The source electrode SE is connected to the semiconductor layer SM through a first contact hole H1 formed to penetrate through the first and second insulating layers 112 and 113. In detail, the source electrode SE is connected to the source area of the semiconductor layer SM. The drain electrode DE is connected to the semiconductor layer SM through a second contact hole H2 formed to penetrate through the first and second insulating layers 112 and 113. In detail, the drain electrode DE is connected to the drain area of the semiconductor layer SM.

The protection layer 114 is disposed to cover the source electrode SE and the drain electrode DE of the thin film transistor TFT. The first electrodes E1 of OLEDs are disposed on the protection layer 114. The first electrodes E1 are connected to the drain electrodes DE of the thin film transistors TFT through contact holes H3 formed to penetrate through the protection layer 114.

A driving voltage is applied to the first electrodes E1 by the thin film transistors TFT to allow the organic light-emitting layers OEL of the OLEDs to emit light. A voltage, which has a polarity opposite to that of the driving voltage, is applied to the second electrode E2. Then, holes and electrons injected into the organic light-emitting layers OEL are recombined with each other to generate excitons. When the excitons return from an excited state to a ground state, the excitons emit energy as light, and thus the OLEDs generate light. Therefore, the OLEDs generate red, green, and blue light according to the current flowing to the OLEDs in order to display a desired image.

In a typical method of manufacturing an OLED display device, the first electrodes E1 are disposed on the substrate 110, and an organic insulating layer is disposed on the substrate 110 to cover the first electrodes E1. In addition, the organic insulating layer typically has a thickness equal to or greater than about 1 μm, and the organic insulating layer is patterned to have a plurality of openings, thereby forming the pixel defining layer. A predetermined portion of the first electrodes E1 is exposed by the openings of the pixel defining layer. The portions exposed through the openings are used as the pixel areas. The organic light-emitting layers are formed on the first electrodes E1 in the pixel areas.

The pixel defining layer formed of the organic insulating layer may have a thickness equal to or greater than about 1 μm. In order to form the organic light-emitting layer, a fluid organic material is provided to the openings of the pixel defining layer. The organic material is cured and the organic light-emitting layers are formed. In this case, the amount of the organic material which contacts the side surface of the pixel defining layer increases due to the surface tension of the organic material. That is, the thickness of the organic light-emitting layer adjacent to the side surfaces of the pixel defining layer becomes thicker than the rest of the organic light-emitting layer (refer to FIG. 7). Thus, the thickness of the organic light-emitting layer may not be even in the pixel area and the brightness of the pixel area may not be uniform.

In the present exemplary embodiment, the pixel defining layer PDL of the OLED display device 100 has a thickness of about 10 nanometers to about 100 nanometers. That is, the pixel defining layer PDL in the present exemplary embodiment has a thickness less than that of a pixel defining layer formed of an organic insulating layer as formed by the typical method. Thus, the overall thickness of the OLED display device 100 may be reduced.

In addition, in the present exemplary embodiment, the pixel defining layer PDL is formed in the non-pixel area NPA on the substrate 110 to cover the boundary surface of the organic light-emitting layers OEL having an inclination angle and to expose the substantially flat area of the organic light-emitting layers OEL. Therefore, the organic light-emitting layers OEL have a substantially uniform thickness in the pixel area PA resulting in a substantially uniform brightness in the pixel areas PA.

As a result, the OLED display device 100 according to the first exemplary embodiment may reduce the overall thickness thereof and have a substantially uniform brightness.

Figure 4A:
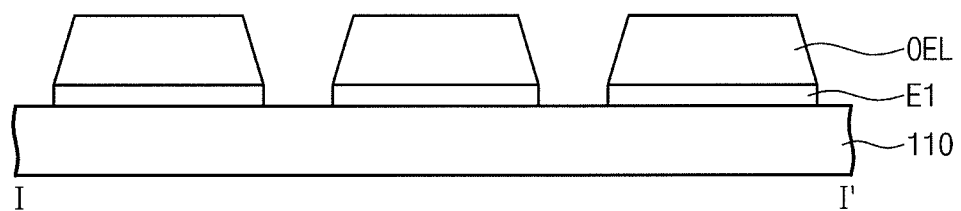
FIGS. 4A to 4C are cross-sectional views showing a manufacturing method of the OLED display device according to the first exemplary embodiment.
Figure 4B:
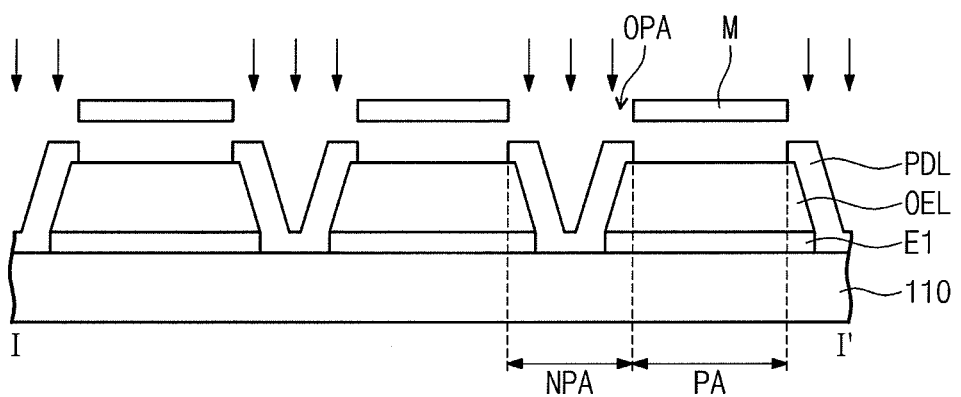
Figure 4C:
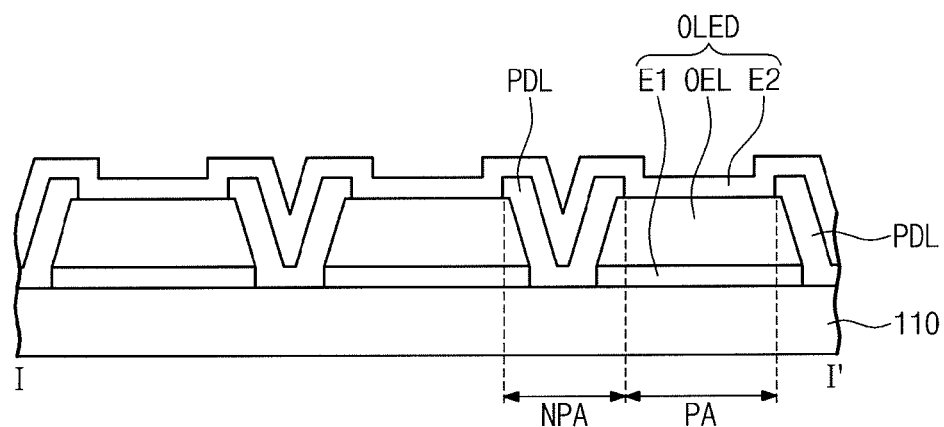

FIGS. 4A to 4C are cross-sectional views showing a manufacturing method of the OLED display device according to the first exemplary embodiment.

For convenience of description, FIGS. 4A to 4C show a manufacturing method for the three arbitrary pixel areas adjacent to each other of FIG. 2.

Referring to FIG. 4A, the substrate 110 including the pixel areas PA and the non-pixel area NPA is prepared, and the first electrodes E1 are formed on the substrate 110. The first electrodes E1 are disposed in areas respectively corresponding to the pixel areas PA.

The organic light-emitting layers OEL are formed on the first electrodes E1 by a printing process (not shown). Each of the first electrodes E1 and each of the organic light-emitting layers OEL have an area greater than that of the corresponding pixel area PA.

Referring to FIG. 4B, a mask M, which has opening areas OPA corresponding to the non-pixel area NPA, is disposed over the substrate 110. The metal-fluoride ionic compound is provided to the substrate 110 through the opening areas OPA of the mask M. As described earlier, the metal-fluoride ionic compound may include one of LiF, BaF2, and CsF. The pixel defining layer PDL is formed by the metal-fluoride ionic compound.

The pixel defining layer PDL is formed in the non-pixel area NPA on the substrate 110 to cover the boundary surface of the organic light-emitting layers OEL having the predetermined inclination angle and to expose the substantially flat area of the organic light-emitting layers OEL. The pixel defining layer PDL has an insulating property and a thickness of about 10 nanometers to about 100 nanometers. However, according to some embodiments, the thickness of the pixel defining layer PDL may be less than about 10 nanometer or greater than about 100 nanometers.

Referring to FIG. 4C, the second electrode E2 is formed on the pixel defining layer PDL and the organic light-emitting layers OEL.

Since the pixel defining layer PDL according to the present exemplary embodiment has a thickness less than that of the pixel defining layer formed by the typical method, the thickness of the OLED display device 100 may be reduced.

When the pixel defining layer formed of the organic insulating layer is formed first and then the organic light-emitting layer is formed, as in the typical method, the thickness of the organic light-emitting layer may be non-uniform in the pixel area. However, in the manufacturing method of the OLED display device 100 according to the first exemplary embodiment, the organic light-emitting layers OEL are formed before the pixel defining layer PDL is formed.

The boundary surface of the organic light-emitting layers OEL, which is formed by a printing process, may have a predetermined inclination angle. Since the organic light-emitting layers OEL are formed first and the pixel defining layer PDL is formed after the organic light-emitting layers OEL, the pixel defining layer PDL may be formed in the non-pixel area NPA on the substrate 110 to cover the boundary surface of the organic light-emitting layers OEL. Therefore, the organic light-emitting layers OEL may have a substantially uniform thickness in the pixel area PA, and the brightness in the pixel area PA may be uniform.

As a result, the OLED display device 100 manufactured according to the present exemplary embodiment may reduce the thickness thereof and have a substantially uniform brightness.

Figure 5:
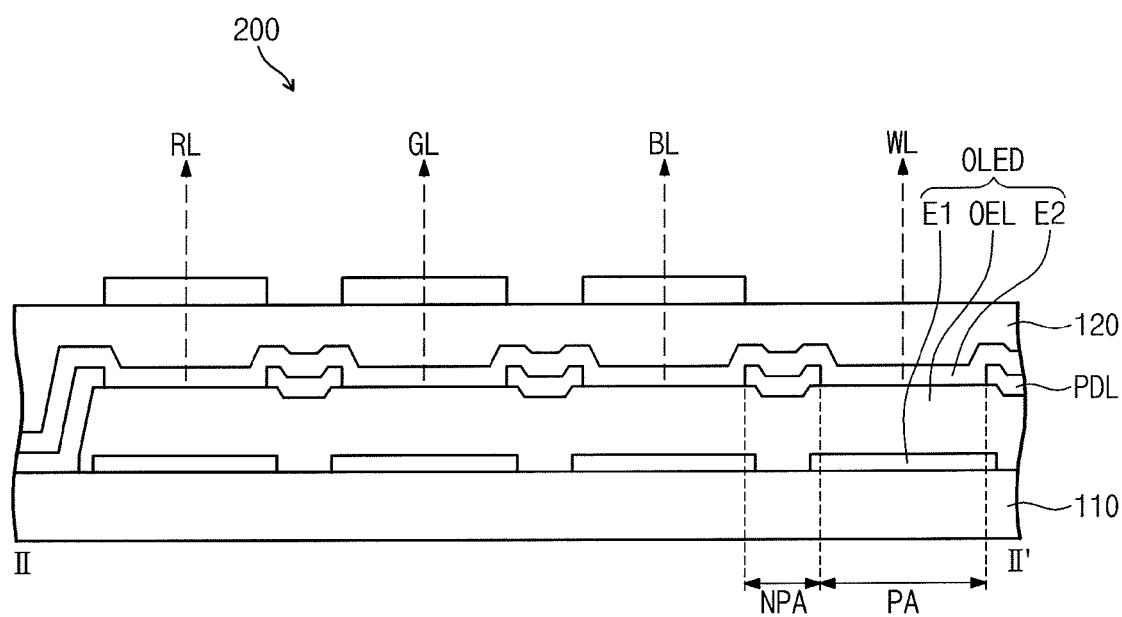
FIG. 5 is a cross-sectional view showing an OLED display device according to a second exemplary embodiment.

FIG. 5 is a cross-sectional view showing an OLED display device according to a second exemplary embodiment.

The OLED display device 200 according to the second exemplary embodiment has substantially the same structure in plan view as that of the OLED display device 100 shown in FIG. 1. Thus, FIG. 5 shows only a cross-sectional view taken along a line I-I' of FIG. 1.

The OLED display device 200 according to the present exemplary embodiment has substantially the same structure as that of the OLED display device 100 shown in FIG. 1 except for the structure of the organic light-emitting layer OEL, the pixel defining layer PDL, and a color filter CF. Thus, the same reference numerals denote the same elements in FIG. 1, and descriptions will be focused on the differences from the OLED display device 100 of FIG. 1.

Referring to FIG. 5, first electrodes E1 are disposed on a substrate 110. The first electrodes E1 are disposed in areas respectively corresponding to pixel areas. Each of the first electrodes E1 has an area greater than that of the corresponding pixel area PA of the pixel areas PA.

An organic light-emitting layer OEL is disposed on the substrate 110 to cover the first electrodes E1. A boundary surface of the organic light-emitting layer OEL has a predetermined inclination angle. The organic light-emitting layer OEL may emit white light. As shown in FIG. 5, the organic light-emitting layer OEL has a substantially flat area except for at the boundary surface having the predetermined inclination angle.

A pixel defining layer PDL is disposed on the substrate 110 to cover the boundary surface of the organic light-emitting layer OEL having the predetermined inclination angle. Additionally, the pixel defining layer PDL is formed to expose the substantially flat area of the organic light-emitting layer OEL in the pixel areas PA and to cover the organic light-emitting layer OEL in the non-pixel area NPA. Thus, the pixel areas PA are defined by the pixel defining layer PDL.

The pixel defining layer PDL may include a metal-fluoride ionic compound, e.g., LiF, BaF2, CsF, etc. The pixel defining layer PDL may have a thickness equal to or greater than about 10 nanometers and has an insulating property. For instance, the pixel defining layer PDL may have a thickness of about 10 nanometers to about 100 nanometers. However, according to some embodiments, the thickness of the pixel defining layer PDL may be less than about 10 nanometers or greater than about 100 nanometers.

A second electrode E2 is formed on the pixel defining layer PDL and the organic light-emitting layer OEL.

The organic light-emitting devices OLED are formed by the first electrode E1, the organic light-emitting layer OEL, and the second electrode E2 in the pixel area PA. That is, the organic light-emitting devices OLED are disposed in the pixel area PA and include the first electrode E1, the organic light-emitting layer OEL, and the second electrode E2 in each pixel area PA. The organic light-emitting devices OLED are white organic light-emitting devices OLED and emit white light.

A thin film sealing layer 120 is disposed on the second electrode E2. Although not shown in figures, the thin film sealing layer 120 may include an inorganic layer or an organic layer. The thin film sealing layer 120 protects the organic light-emitting devices OLED.

A plurality of color filters CF are formed on the thin film sealing layer 120. As shown in FIG. 5, the color filters CF are repeatedly disposed in three consecutive pixel areas PA of four adjacent pixel areas PA. The color filter CF is not disposed in the remaining pixel area PA among the four adjacent pixel areas PA.

The color filters CF are included in respective pixels in order to display one of red, green, and blue colors. In the present exemplary embodiment, the color filters may be arranged in the pixel areas PA in the order of red, green, and blue from the left side pixel area.

A driving voltage is applied to the first electrodes E1 to allow the organic light-emitting layer OEL to emit light, and a voltage having a polarity opposite to that of the driving voltage is applied to the second electrode E2.

The pixel defining layer PDL has an insulating property. The organic light-emitting layer OEL does not contact the second electrode E2 in the non-pixel area NPA defined by the pixel defining layer PDL. That is, the voltage applied to the second electrode E2 is not provided to the organic light-emitting layer OEL in the non-pixel area NPA. Thus, the organic light-emitting layer OEL does not generate light in the non-pixel area NPA. As a result, the organic light-emitting layer OEL generates white light in the pixel area PA due to the voltages applied to the first and second electrodes E1 and E2.

For instance, the organic light-emitting display device 200 according to the present exemplary embodiment may be a front surface light emission type OLED display device. In this case, white light generated from the organic light-emitting layer OEL is reflected by the first electrodes E1 and travels in an upward direction after passing through the second electrode E2.

The white light generated from the organic light-emitting devices OLED is filtered according to the color filters CF to display a predetermined color. That is, red light RL, green light GL, and blue light BL may be emitted through the color filters assigned to the pixel areas PA.

The light generated in the pixel area PA where no color filter CF is disposed, remains white. Thus, the OLED display device 200 according to the present exemplary embodiment may generate red, green, blue, and white light.

In the present exemplary embodiment, the OLED display device 200 is a front surface light emission type, but is not limited thereto. That is, the OLED display device 200 may be a rear surface light emission type. When the OLED display device 200 is a rear surface light emission type, the color filters CF are disposed under the first electrodes E1. The color filters CF are repeatedly disposed for three consecutive pixel areas PA of four adjacent pixel areas PA. A color filter is not disposed in the remaining pixel area PA among the four adjacent pixel areas PA. White light generated from the organic light-emitting layer OEL is reflected by the second electrode E2 and travels in a lower direction after passing through the first electrodes E1.

As previously described, in a typical OLED display device, the pixel defining layer is formed of an organic insulating layer and has a thickness of about 1 μm. However, the pixel defining layer PDL of the OLED display device 200 according to the present exemplary embodiment has a thickness of about 10 nanometers to about 100 nanometers. Thus, the thickness of the OLED display device 200 may be reduced. However, according to some embodiments, the thickness of the pixel defining layer PDL may be less than about 10 nanometers or greater than about 100 nanometers.

In the present exemplary embodiment, the pixel defining layer PDL is formed in the non-pixel area NPA to cover the boundary surface of the organic light-emitting layer OEL having the predetermined inclination angle to expose the substantially flat area of the organic light-emitting layer OEL in the pixel area PA. Thus, the organic light-emitting devices OLED include organic light-emitting layers OEL having a substantially uniform thickness in the pixel area PA, resulting in a substantially uniform brightness in the pixel area PA.

As a result, the OLED display device 200 according to the present exemplary embodiment may have a reduced thickness and a substantially uniform brightness.

FIGS. 6A to 6E are cross-sectional views showing a manufacturing method of the organic light-emitting display device according to the present exemplary embodiment.

For convenience of description, FIGS. 6A to 6E show a manufacturing method of the four arbitrary pixel areas PA adjacent to each other in FIG. 5.

Figure 6A:
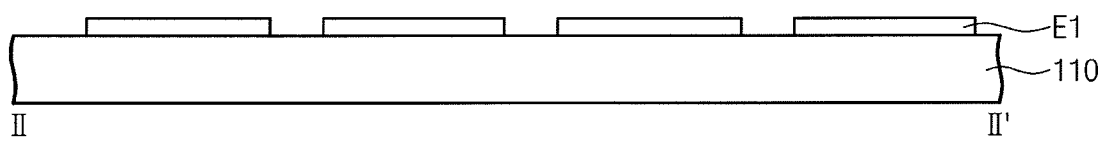
FIGS. 6A to 6E are cross-sectional views showing a manufacturing method of the OLED display device according to the second exemplary embodiment.

Referring to FIG. 6A, the substrate 110 including the pixel areas PA and the non-pixel area NPA is prepared, and the first electrodes E1 are formed on the substrate 110. The first electrodes E1 are disposed to correspond to respective pixel areas PA, and each of the first electrodes E1 has an area greater than that of the corresponding pixel area PA.

Figure 6B:
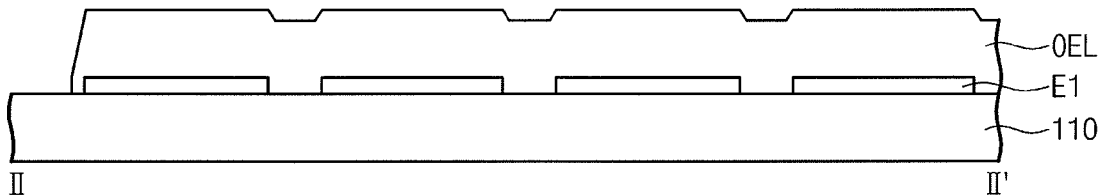

Referring to FIG. 6B, the organic light-emitting layer OEL is formed on the substrate 110 to cover the first electrodes E1 by a printing process (not shown). The organic light-emitting layer OEL generates white light. As described earlier, the boundary surface of the organic light-emitting layer OEL has a predetermined inclination angle.

Figure 6C:
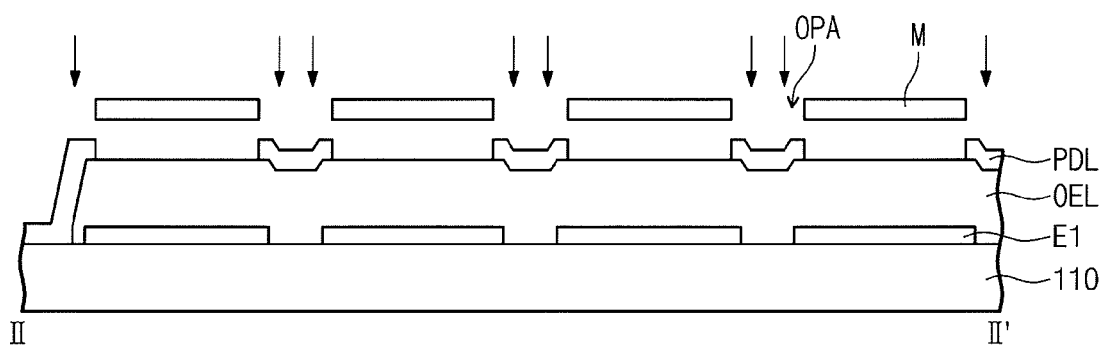

Referring to FIG. 6C, a mask M, which has opening areas OPA corresponding to the non-pixel area NPA, is disposed on the substrate 110. A metal-fluoride ionic compound is provided to the substrate 110 through the opening areas OPA of the mask M. As described above, the metal-fluoride ionic compound may include a metal-fluoride ionic compound, e.g., LiF, BaF2, CsF, etc. The pixel defining layer PDL is formed by using the metal-fluoride ionic compound. The pixel defining layer PDL has an insulating property and a thickness of about 10 nanometers to about 100 nanometers. However, according to some embodiments the pixel defining layer PDL may have a thickness of less than about 10 nanometers or greater than about 100 nanometers.

The pixel defining layer PDL is formed on the substrate 110 to cover the boundary surface of the organic light-emitting layer OEL having the predetermined inclination angle. In addition, the pixel defining layer PDL exposes the substantially flat area of the organic light-emitting layer OEL in the pixel areas PA and covers the organic light-emitting layer OEL in the non-pixel area NPA.

Figure 6D:
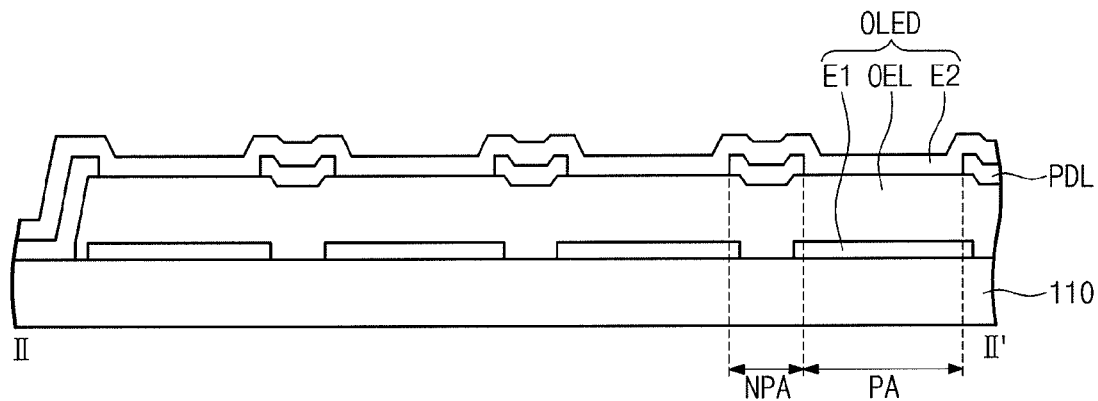

Referring to FIG. 6D, the second electrode E2 is formed on the pixel defining layer PDL and the organic light-emitting layer OEL.

Figure 6E:
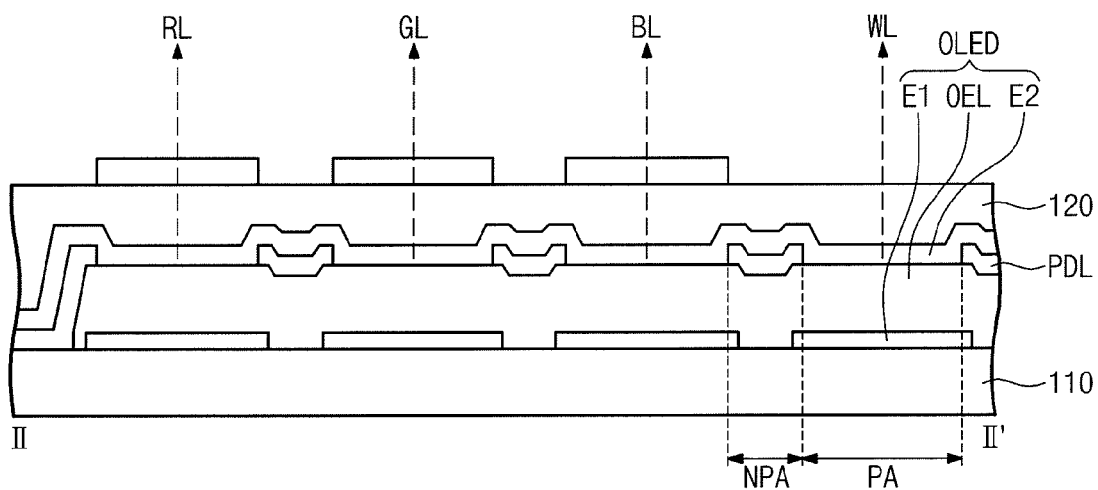

Referring to FIG. 6E, the thin film sealing layer 120 is formed on the second electrode E2. Color filters CF are formed on the thin film sealing layer 120.

The color filters CF are repeatedly disposed in three consecutive pixel areas PA of four adjacent pixel areas PA. A color filter CF is not disposed in the remaining pixel area PA among the four adjacent pixel areas PA. The color filters CF are included in respective pixels in order to display one of red, green, and blue colors.

Since the pixel defining layer PDL according to the present embodiment has a thickness smaller than that of the typical pixel defining layer formed of the organic insulating layer, the thickness of the OLED display device 200 may be reduced.

In the present exemplary embodiment, the pixel defining layer PDL is formed on the organic light-emitting layer OEL in the non-pixel area NPA to cover the boundary surface of the organic light-emitting layer OEL having the predetermined inclination angle and to expose the substantially flat area of the organic light-emitting layer OEL in the pixel areas PA. Thus, the organic light-emitting layers OEL of the organic light-emitting devices OLED have a substantially uniform thickness in the pixel areas PA, and the brightness in the pixel areas PA becomes substantially uniform.

As a result, the OLED display device 200 according to the second exemplary embodiment may have a reduced thickness and a substantially uniform brightness.

Figure 7:
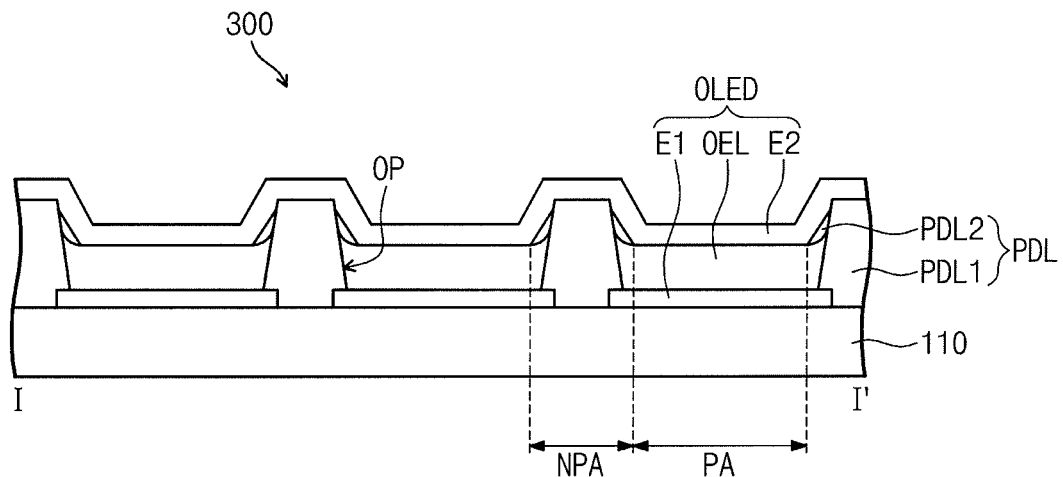
FIG. 7 is a cross-sectional view showing an OLED display device according to a third exemplary embodiment.

FIG. 7 is a cross-sectional view showing an OLED display device according to a third exemplary embodiment.

The OLED display device 300 according to the third exemplary embodiment has substantially the same structure in plan view as that of the OLED display device 100 shown in FIG. 1. Thus, FIG. 7 shows a cross-sectional view taken along line I-I' of FIG. 1.

The OLED display device 300 according to the present exemplary embodiment has the same structure as that of the OLED display device 100 shown in FIG. 1 except for the structure of the organic light-emitting layer OEL and the pixel defining layer PDL. Thus, the same reference numerals denote the same elements in FIG. 1, and descriptions will be focused on the differences from the OLED display device 100 of FIG. 1.

Referring to FIG. 7, first electrodes E1 are disposed on a substrate 110. The first electrodes E1 are disposed in areas corresponding to the respective pixel areas PA. Each of the first electrodes E1 has an area greater than that of the corresponding pixel area PA.

A pixel defining layer PDL of the OLED display device 300 includes a first pixel defining layer PDL1 and a second pixel defining layer PDL2. That is, the pixel areas PA are defined by the first and second pixel defining layers PDL1 and PDL2.

The first pixel defining layer PDL1 is disposed on the substrate 110 to cover a boundary surface of the first electrodes E1. The first pixel defining layer PDL1 includes a plurality of openings OP corresponding to the pixel areas PA. Each of the openings OP has an area greater than that of the corresponding pixel area PA. Each of the openings OP of the first pixel defining layer PDL1 exposes a predetermined portion of a corresponding first electrode E1. The first pixel defining layer PDL1 includes an organic insulating layer and has a thickness equal to or greater than about 1 μm. However, according to some embodiments, the thickness of the first pixel defining layer PDL1 may be less than about 1 μm.

Organic light-emitting layers OEL are disposed on the first electrodes E1 in the openings OP of the first pixel defining layer PDL1. The organic light-emitting layers OEL may include an organic material that generates light of red, green, and blue colors.

A fluid organic material is provided in the openings OP of the first pixel defining layer PDL1 to form the organic light-emitting layers OEL. The organic material is cured to form the organic light-emitting layers OEL. In this case, a certain amount of the organic material which contacts the side surfaces of the first pixel defining layer PDL1, has an increased thickness due to the surface tension of the fluid organic material. That is, a thickness of the organic light-emitting layer OEL adjacent to the side surfaces of the first pixel defining layer PDL1 becomes thicker than the rest of the organic light-emitting layer OEL as shown in FIG. 7.

The second pixel defining layer PDL2 is disposed to cover a portion of the side surfaces of the first pixel defining layer PDL1 adjacent to the organic light-emitting layers OEL and a portion of the organic light-emitting layers OEL adjacent to the side surfaces of the first pixel defining layer PDL1. The portion of the organic light-emitting layers OEL adjacent to the side surface of the first pixel defining layer PDL1 is defined as an area having a thickness greater than that of the rest of the organic light-emitting layers OEL. Thus, a substantially flat area of the organic light-emitting layers OEL is exposed by the second pixel defining layer PDL2. In addition, a boundary surface between the pixel areas PA and the non-pixel area NPA is formed by the second pixel defining layer PDL2.

The second pixel defining layer PDL2 may include a metal-fluoride ionic compound, e.g., LiF, BaF2, CsF, etc. The second pixel defining layer PDL2 may have a thickness equal to or greater than about 10 nanometers and has an insulating property. For instance, the second pixel defining layer PDL2 has a thickness of about 10 nanometers to about 100 nanometers. However, according to some embodiments, the thickness of the second pixel defining layer PDL2 may be less than about 10 nanometers or greater than about 100 nanometers.

A second electrode E2 is disposed on the first and second pixel defining layers PDL1 and PDL2 and the organic light-emitting layer OEL.

A driving voltage is applied to the first electrodes E1 by the thin film transistors TFT to allow the organic light-emitting layer OEL to emit light, and a voltage having a polarity opposite to that of the driving voltage is applied to the second electrode E2.

The second pixel defining layer PDL2 has an insulating property. The portion of the organic light-emitting layers OEL adjacent to the side surface of the first pixel defining layer PDL1 does not contact the second electrode E2 because of the second pixel defining layer PDL2. That is, the voltage applied to the second electrode E2 is not applied to the portion of the organic light-emitting layers OEL adjacent to the side surface of the first pixel defining layer PDL1. Thus, light is not generated from the portion of the organic light-emitting layers OEL adjacent to the side surface of the pixel defining layer PDL1.

The substantially flat area of the organic light-emitting layers OEL may be exposed by using the second pixel defining layer PDL2 having a thickness smaller than that of the first pixel defining layer PDL1. Thus, the organic light-emitting layers OEL of the organic light-emitting devices OLED have a substantially uniform thickness in the pixel areas PA. Since light is generated from the organic light-emitting layers OEL having a substantially uniform thickness, the brightness in the pixel areas PA becomes substantially uniform.

As a result, the organic light-emitting display device 300 according to the present exemplary embodiment may have a substantially uniform brightness.

FIGS. 8A to 8D are cross-sectional views showing a manufacturing method of the organic light-emitting device according to the third exemplary embodiment.

For convenience of description, FIGS. 8A to 8D show a manufacturing method of the three arbitrary pixel areas PA adjacent to each other shown in FIG. 7.

Figure 8A:
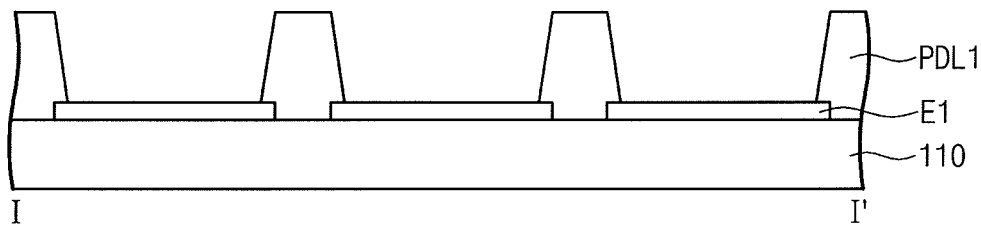
FIGS. 8A to 8D are cross-sectional views showing a manufacturing method of the OLED device according to the third exemplary embodiment.

Referring to FIG. 8A, the substrate 110 including the pixel areas PA and the non-pixel area NPA is prepared, and the first electrodes E1 are formed on the substrate 110. The first electrodes E1 are disposed in areas corresponding to the respective pixel areas PA. Each of the first electrodes E1 has an area greater than that of the corresponding pixel area PA.

The first pixel defining layer PDL1 is formed on the substrate 110 to cover the boundary surface of the first electrodes E1. The first pixel defining layer PDL1 includes openings OP formed in areas respectively corresponding to the pixel areas PA. Each of the openings OP has an area greater than that of the corresponding pixel area PA. Each of the openings OP of the first pixel defining layer PDL1 exposes a predetermined portion of corresponding first electrode E1.

Although not shown in figures, an organic insulating layer is formed on the substrate 110 to cover the first electrodes E1. The organic insulating layer has a thickness equal to or greater than about 1 p.m. The organic insulating layer is patterned to have the openings OP, thereby forming the first pixel defining layer PDL1. Thus, the first pixel defining layer PDL1 is formed of the organic insulating layer and has a thickness equal to or greater than about 1 μm. However, according to some embodiments, the thickness of the first pixel defining layer PDL1 may be less than about 1 μm.

Figure 8B:
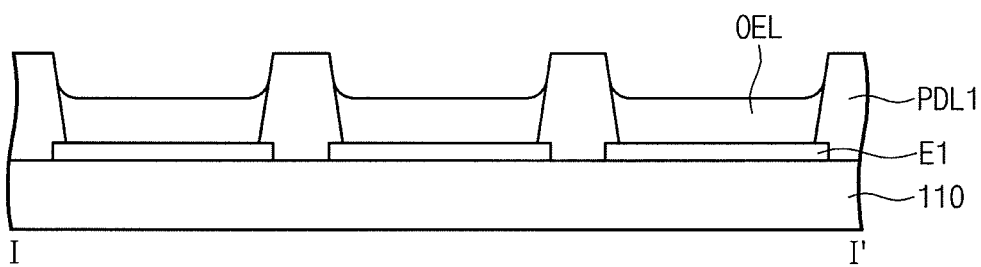

Referring to FIG. 8B, the organic light-emitting layers OEL are formed on the first electrodes E1 in the openings OP of the first pixel defining layer PDL1.

Although not shown in figures, a fluid organic material is provided in the openings OP of the first pixel defining layer PDL1 to form the organic light-emitting layers OEL, and the organic material is cured to form the organic light-emitting layers OEL. As described above, the thickness of the organic light emitting-layers OEL adjacent to the side surface of the first pixel defining layer PDL1 is greater than the thickness of the rest of the organic light-emitting layers OEL.

Figure 8C:
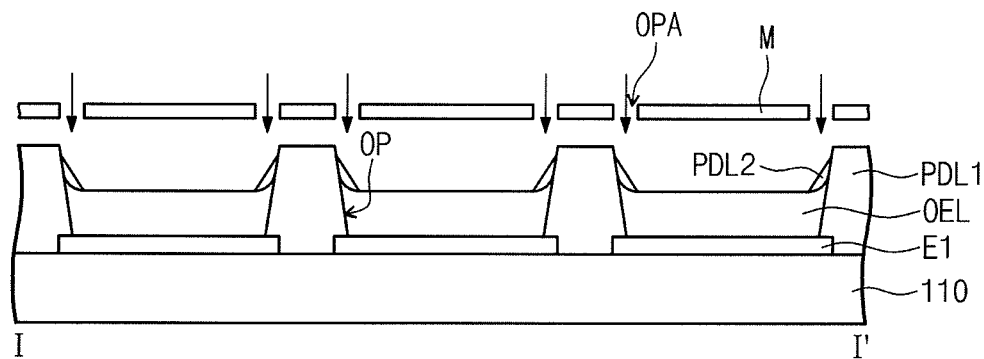

Referring to FIG. 8C, a mask M having opening areas OPA corresponding to the portion of the side surface of the first pixel defining layer PDL1 adjacent to the organic light-emitting layers OEL and the portion of the organic light-emitting layers OEL adjacent to the side surface of the first pixel defining layer PDL1 is disposed on the substrate 110 to correspond to the non-pixel area NPA. A metal-fluoride ionic compound is provided to the substrate 110 through the opening areas OPA of the mask M. The metal-fluoride ionic compound may include a metal-fluoride ionic compound, e.g., LiF, BaF2, CsF, etc. The second pixel defining layer PDL2 may be formed by using the metal fluoride compound.

The second pixel defining layer PDL2 is formed to cover the portion of the side surface of the first pixel defining layer PDL1 adjacent to the organic light-emitting layers OEL and the portion of the organic light-emitting layers OEL adjacent to the side surface of the first pixel defining layer PDL1. The second pixel defining layer PDL2 has an insulating property and a thickness of about 10 nanometers to about 100 nanometers. However, according to some embodiments, the thickness of the second pixel defining layer PDL2 may be less than about 10 nanometer or greater than about 100 nanometers.

The substantially flat area of the organic light-emitting layers OEL is exposed by the second pixel defining layer PDL2. In addition, the boundary surface between the pixel areas PA and the non-pixel area NPA is formed by the second pixel defining layer PDL2.

Figure 8D:
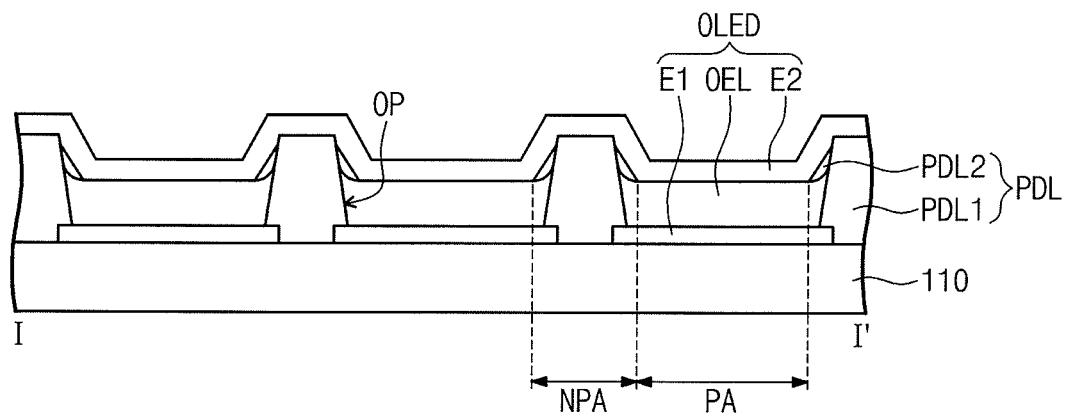

Referring to FIG. 8D, the second electrode E2 is formed on the first and second pixel defining layers PDL1 and PDL2 and the organic light-emitting layer OEL.

The substantially flat area of the organic light-emitting layers is exposed by using the second pixel defining layer PDL2 having a thickness smaller than that of the first pixel defining layer PDL1. Thus, the organic light-emitting layers OEL of the organic light-emitting devices OLED have a substantially uniform thickness in the pixel areas PA. Since light is generated from the organic light-emitting layers OEL having a substantially uniform thickness, the brightness in the pixel areas PA becomes substantially uniform.

As a result, the OLED display device 300 manufactured according to the third exemplary embodiment may have substantially uniform brightness.

Although exemplary embodiments of the disclosed technology have been described, it is understood that the described technology should not be limited to these exemplary embodiments but various changes and modifications can be made by one ordinary skilled in the art within the spirit and scope of the described technology as defined by the accompanying claimed.

What is claimed is:

1. An organic light-emitting diode (OLED) display comprising:
    a substrate comprising a plurality of pixel areas and a non-pixel area defined between the pixel areas adjacent to each other;
    a plurality of first electrodes disposed on the substrate respectively corresponding to the pixel areas;
    a plurality of organic light-emitting layers formed respectively over the first electrodes;
    a pixel defining layer defining the pixel areas and disposed in the non-pixel area and covering a boundary surface of the organic light-emitting layers; and
    a second electrode disposed on the organic light-emitting layers and the pixel defining layer.

2. The OLED display of claim 1, wherein each of the first electrodes and each of the organic light-emitting layers have an area greater than the area of the corresponding pixel area, and wherein the pixel defining layer exposes a substantially flat area of the organic light-emitting layers.

3. The OLED display of claim 1, wherein the pixel defining layer is formed at least partially of a metal-fluoride ionic compound.

4. The OLED display of claim 3, wherein the metal-fluoride ionic compound comprises at least one of LiF, BaF2, or CsF.

5. The OLED display of claim 1, wherein the pixel defining layer has a thickness of about 10 nanometers to about 100 nanometers.

6. The OLED display of claim 1, wherein the boundary surface comprises edge portions of the organic light-emitting layers formed in opposing ends thereof.

7. The OLED display of claim 1, wherein the boundary surface forms an acute angle with respect to the first electrodes.

* * * * *